United States Patent
Toutsuka et al.

(10) Patent No.: US 7,544,345 B2
(45) Date of Patent: Jun. 9, 2009

(54) MAGNESIUM OXIDE SINGLE CRYSTAL HAVING CONTROLLED CRYSTALLINITY AND METHOD FOR PRODUCING THE SAME

(75) Inventors: Atsuo Toutsuka, Hyogo (JP); Yoshifumi Kawaguchi, Hyogo (JP); Masaaki Kunishige, Hyogo (JP)

(73) Assignee: Tateho Chemical Industries Co., Ltd., Hyogo (JP)

( * ) Notice: Subject to any disclaimer, the term of this patent is extended or adjusted under 35 U.S.C. 154(b) by 217 days.

(21) Appl. No.: 11/722,921

(22) PCT Filed: Dec. 28, 2005

(86) PCT No.: PCT/JP2005/024027

§ 371 (c)(1),
(2), (4) Date: Jun. 27, 2007

(87) PCT Pub. No.: WO2006/070855

PCT Pub. Date: Jul. 6, 2006

(65) Prior Publication Data

US 2008/0081767 A1     Apr. 3, 2008

(30) Foreign Application Priority Data

Dec. 28, 2004   (JP) .................... 2004-380169

(51) Int. Cl.
*C01F 5/02* (2006.01)
*C30B 29/16* (2006.01)
*C30B 33/02* (2006.01)
*C30B 33/04* (2006.01)

(52) U.S. Cl. ................ 423/635; 117/3; 505/238; 505/330

(58) Field of Classification Search ............... 502/340; 423/635, 636; 117/3; 505/238, 330
See application file for complete search history.

(56) References Cited

U.S. PATENT DOCUMENTS 3,634,033 A * 1/1972 Butler et al. ............... 423/636

FOREIGN PATENT DOCUMENTS

| JP | 02-263794 A | 10/1990 |
|---|---|---|
| JP | 05-170430 | 7/1993 |
| JP | 06-305887 A | 11/1994 |
| JP | 06305887 A * | 11/1994 |
| JP | 09-309799 | 12/1997 |
| JP | 11-349399 | 12/1999 |
| JP | 2000-086400 A | 3/2000 |

* cited by examiner

*Primary Examiner*—Timothy C Vanoy
*Assistant Examiner*—Serena L Hanor
(74) *Attorney, Agent, or Firm*—Lucas & Mercanti, LLP

(57) ABSTRACT

A magnesium oxide single crystal having controlled crystallinity has a subboundary, and ranges of variation of diffraction line positions, as measured for reciprocal lattice maps with respect to a region surrounded by the same subboundary, with the range of the variation of $1\times10^{-3}$ to $2\times10^{-2}$ degree of on $\Delta\omega$ coordinates, and with the range of the variation of $4\times10^{-4}$ to $5\times10^{-3}$ degree on $2\theta$ coordinates.

5 Claims, 2 Drawing Sheets

MAGNESIUM OXIDE SINGLE CRYSTAL HAVING CONTROLLED CRYSTALLINITY AND METHOD FOR PRODUCING THE SAME

This application claims priority under 35 USC 119 to Japanese Patent Application No. 2004-380169 filed on Dec. 28, 2004, the contents of which are herein incorporated by reference.

FIELD OF THE INVENTION

The present invention relates to a magnesium oxide (MgO) single crystal having controlled crystallinity, a method for producing the same, a MgO single crystal substrate obtained from the MgO single crystal having controlled crystallinity, and a superconducting device using the MgO single crystal substrate.

BACKGROUND ART

MgO single crystals are applied to a wide variety of uses, such as a substrate for an oxide superconductor thin film, a substrate for oxide dielectric thin film, a high heat-conductive substrate, an optical lens, a window material for infrared ray transmission, and a target material used in vapor deposition or sputtering for producing, e.g., a protective film for plasma display panel (PDP). Particularly, the MgO single crystal has excellent lattice match with an oxide superconductor and a coefficient of thermal expansion equivalent to that of the oxide superconductor, and further has a low permittivity, and hence recently has drawn attention as a substrate for oxide superconductor thin film used in a high frequency device.

MgO has a high vapor pressure, and therefore a MgO single crystal is generally produced by an arc electrofusing method. The arc electrofusing method is a method in which electrodes are inserted into magnesia clinker as a raw material in order to melt the raw material, and a skull layer is formed from the melted raw material and the raw material melt is kept by self-lining to effect crystallization. Therefore, the arc electrofusing method has a problem in that control of the conditions for forming a single crystal is difficult, thus making it difficult to obtain a single crystal having a large size.

For solving the problem, there have been proposed a method for producing a MgO single crystal having a large size, in which powdered magnesia is put on the raw material magnesia clinker layer to stabilize the closure and temperature in the electric furnace (patent document 1), and a method for producing a MgO single crystal having a large size, in which the furnace is densely filled with a high-purity raw material having a magnesia with purity of 99.8% or more (patent document 2).

The above improvements of the arc electrofusing method make it possible to produce a MgO single crystal having a relatively large size. However, the arc electrofusing method is not a method in which a single crystal is allowed to grow successively on a seed crystal, such as a conventional single crystal growth method, e.g., a pulling method, and therefore the arc electrofusing method has a fundamental problem of that it is difficult to obtain a single crystal having excellent crystalline properties and a large size.

For solving the problem, the improvement of the arc electrofusing method has been proposed in which the cooling rate is controlled by changing the electrode pulling speed to restrict the number of subboundaries and the dislocation density (patent document 3), and it has been reported that a MgO single crystal substrate having excellent crystalline properties can be obtained by this method.

A MgO single crystal substrate having a large size and excellent crystalline properties can be obtained by the above method; however, when, for example, an oxide superconductor thin film is formed on the resultant substrate, a problem arises in that the oxide superconductor thin film obtained is not uniform in the superconducting properties and is not stable in the performance. The reason for this is presumed that MgO is easily reacted with moisture or carbonic acid gas in air to change the surface state of the substrate with time.

As a method for improving the surface of the MgO single crystal substrate, a method in which the substrate surface is treated with weakly acidic cleaning water having a specific pH (patent document 4), a method in which the substrate surface is subjected to heat treatment after the removal step by polishing (patent document 5), and a method in which the calcium (Ca) and silicon (Si) contents are specified to improve the surface smoothness of the MgO single crystal substrate (patent document 6) have been proposed.

By the above methods for improving the surface of the MgO single crystal substrate, a superconductor thin film formed on the substrate can be improved in superconducting properties to some extent, but satisfactory results are not obtained. Therefore, a MgO single crystal substrate advantageous in that, particularly, a superconductor thin film formed on the substrate exhibits excellent superconducting properties is desired.

[Patent document 1] Japanese Unexamined Patent Publication No. Hei 02-263794

[Patent document 2] Japanese Unexamined Patent Publication No. Hei 05-170430

[Patent document 3] Japanese Unexamined Patent Publication No. Hei 06-305887

[Patent document 4] Japanese Unexamined Patent Publication No. Hei 09-309799

[Patent document 5] Japanese Unexamined Patent Publication No. 2000-86400

[Patent document 6] Japanese Unexamined Patent Publication No. Hei 11-349399

DISCLOSURE OF THE INVENTION

Problems to be Solved by the Invention

It is an object of the present invention to solve the above problems, and to provide a MgO single crystal having controlled crystalline properties, which can be used as a substrate particularly useful in forming an oxide superconductor thin film, a method for producing the same, and a superconducting device comprising a superconductor thin film formed on the MgO single crystal substrate.

Means to Solve the Problems

The present inventors have conducted extensive and intensive studies with a view toward attaining the above object, and paid attention to a crystalline properties of the MgO single crystal in a region surrounded by a subboundary. As a result, it has been found that the MgO single crystal having controlled crystallinity having a diffraction line position with specific variation exhibits excellent performance when used as a substrate for superconductor thin film.

Further, it has been found that the MgO single crystal having controlled crystalline properties can be obtained by the method for producing the MgO single crystal having controlled crystallinity, which comprises subjecting a MgO single crystal preliminarily prepared by, for example, an arc electrofusing method to heat treatment under specific conditions.

Specifically, in the present invention, there is provided a MgO single crystal having controlled crystallinity comprising a subboundary, and ranges of variation of diffraction line coordinate positions, as measured for reciprocal lattice maps with respect to a region surrounded by the same subboundary, with the range of the variation of $1 \times 10^{-3}$ to $2 \times 10^{-2}$ degree of on $\Delta\omega$ coordinates, and with the range of the variation of $4 \times 10^{-4}$ to $5 \times 10^{-3}$ degree on $2\theta$ coordinates.

Further, in the present invention, there are provided a substrate of the MgO single crystal having controlled crystallinity obtained from the MgO single crystal having controlled crystallinity, and a superconducting device comprising a thin film comprised of a material having superconducting properties formed on the substrate of the MgO single crystal having controlled crystallinity.

Furthermore, in the present invention, there is provided a method for producing a MgO single crystal having controlled crystallinity, the method comprising: preparing a MgO single crystal; elevating the temperature of the MgO single crystal to 2,613 K or higher by heating; and, immediately after completion of the temperature elevation, or after keeping the temperature for a predetermined period of time, cooling the resultant MgO single crystal to 2,473 K at a cooling rate of 50 to 300 K/hr, wherein the method further comprising subjecting the magnesium oxide single crystal to the heat treatment with keeping the temperature in the range of 2,613 K or higher, for a total time period of 10,800 seconds or shorter including time required for the temperature elevation and the cooling.

BEST MODE FOR CARRYING OUT THE INVENTION

Figure 1:
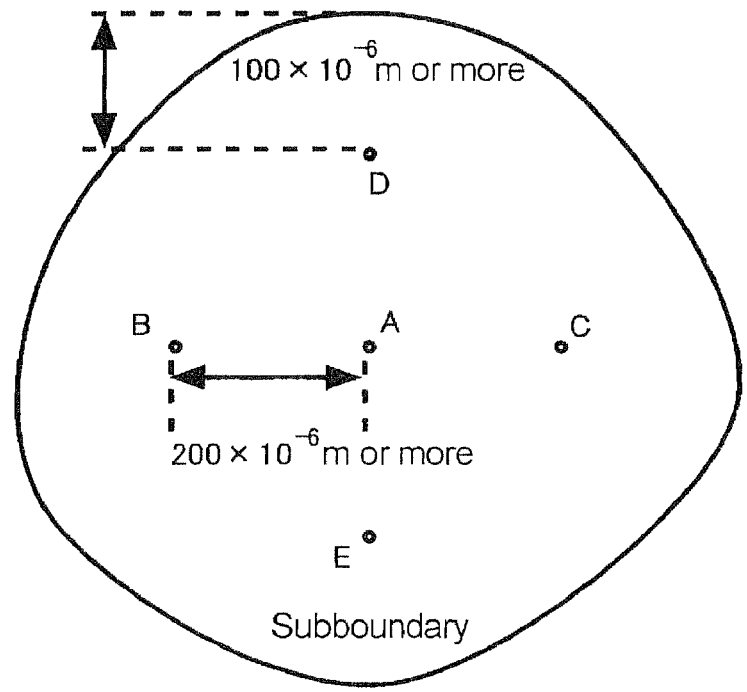
[FIG. 1] Diagram for explaining the locations of measurements for evaluation of the crystalline properties of the MgO single crystal having controlled crystallinity of the present invention in a region surrounded by a subboundary.

The MgO single crystal having controlled crystallinity of the present invention has a subboundary, and has ranges of variation of diffraction line coordinate positions, as measured for reciprocal lattice maps with respect to a region surrounded by the same subboundary, with the range of the variation of $4 \times 10^{-4}$ to $5 \times 10^{-3}$ degree on $2\theta$ coordinates, and with the range of the variation of $1 \times 10^{-3}$ to $2 \times 10^{-2}$ degree of on $\Delta\omega$ coordinates. With respect to the number of the subboundaries, there is no particular limitation, but the number of the subboundaries is generally 1 to $5 \times 10^{6}/m^{2}$.

The range of variation on the $2\theta$ coordinates indicates the magnitude of variation of the lattice spacings. When the range of variation on the $2\theta$ coordinates falls within the above range, the MgO single crystal having controlled crystallinity, which particularly is used as a substrate for oxide superconductor thin film, does not adversely affect the crystalline properties of an oxide superconductor formed on the substrate, and serves as a pinning center, exhibiting excellent effect.

The range of variation on the $\Delta\omega$ coordinates indicates the magnitude of variation of the lattice plane orientations. When the range of variation on the $\Delta\omega$ coordinates falls within the above range, the MgO single crystal having controlled crystallinity, which particularly is used as a substrate for oxide superconductor thin film, does not adversely affect the crystalline properties of an oxide superconductor thin film formed on the substrate, and serves as a pinning center, enabling the thin film to maintain high superconducting properties.

The MgO single crystal having controlled crystallinity of the present invention can be applied to a variety of uses. Specifically, the MgO single crystal having controlled crystallinity is advantageously used as a substrate for forming a superconductor thin film or ferroelectric thin film, and, especially when the MgO single crystal is used as a substrate for superconductor thin film, it exhibits such excellent effect that the MgO single crystal remarkably improves the superconducting properties of a superconductor thin film formed on the substrate.

The MgO single crystal having controlled crystallinity of the present invention has microscopic crystalline properties in a region surrounded by the subboundary controlled to be in a specific range, and the crystalline properties in adjacent regions surrounded by the individual subboundaries are extremely uniform, and hence the MgO single crystal can also be advantageously used as an optical lens or a window material for infrared ray.

Next, the method for producing a MgO single crystal having controlled crystallinity of the present invention is described. A raw material MgO single crystal, which is a starting material for the MgO single crystal having controlled crystallinity of the present invention, is prepared first. With respect to the method for preparing a raw material MgO single crystal, there is no particular limitation, but it is preferably prepared by an arc electrofusing method.

A process for preparing a raw material MgO single crystal using an arc electrofusing method is described. For example, seawater magnesia clinker having a predetermined composition is placed in an electric furnace having carbon electrodes embedded therein to form a magnesia clinker layer. Powdered magnesia having a particle size preliminarily adjusted is put on the resultant magnesia clinker layer from the upper portion of the furnace to form a magnesia powder layer. Subsequently, an electric current is applied to the carbon electrodes to effect electrical fusion of the magnesia powder, followed by cooling, to obtain a raw material MgO single crystal having uncontrolled crystallinity.

The thus obtained raw material MgO single crystal is subjected to heat treatment, which is the characteristic feature of the present invention, to obtain a MgO single crystal having controlled crystallinity having desired crystalline properties. Specifically, the heat treatment is conducted as follows.

The above-prepared raw material MgO single crystal is first put on a crucible made of, for example, carbon, and the crucible is placed in a closed carbon resistance heating furnace. Prior to a temperature elevation step, it is preferred that the furnace is evacuated and then the pressure in the furnace is increased to 0.2 to 2.0 MPa with inert gas. As the inert gas, argon (Ar), helium (He), or mixed gas of them can be used.

In this state, the temperature in the furnace is elevated to a predetermined heat treatment temperature, i.e., 2,613 K or higher. With respect to the temperature elevation rate, there is no particular limitation, but the temperature elevation rate is generally 100 to 900 K/hr, further preferably 300 to 700 K/hr.

When the heat treatment temperature is lower than 2,613 K, the MgO single crystal undergoes almost no change in crystalline properties, making it difficult to introduce variation into the lattice spacings in a region surrounded by the subboundary to control the crystalline properties desirably. On the other hand, the higher the heat treatment temperature, the more excellent the effect to control the crystalline properties. However, when the heat treatment temperature is too high, the total time during which the temperature is kept in the range of 2,613 K or higher, including the temperature elevation time and the cooling time, is prolonged and hence variation of the crystalline properties is advanced, so that, conversely, the range of variation on the $\Delta\omega$ coordinates may be reduced to excess. Further, when the heat treatment temperature is extremely high, a problem occurs in that MgO is evaporated or is likely to cause a side reaction with the material for crucible. From the viewpoint of achieving an effect to improve the superconducting properties and facilitating the operation of treatment, the heat treatment temperature is preferably 2,673 to 2,913 K, further preferably 2,723 to 2,873 K.

Immediately after completion of the temperature elevation to the heat treatment temperature, cooling is started, or the heat treatment temperature is kept for a predetermined period of time. In this instance, the time is controlled so that the total time during which the temperature is kept in the range of 2,613 K or higher becomes 10,800 seconds or shorter, including the temperature elevation time and the cooling time. When the total time during which the temperature is kept in the range of the heat treatment temperature is too long, variation of the crystalline properties is advanced to excess, so that the range of variation on the $\Delta\omega$ coordinates may fall outside of the desired range. The heat treatment time is preferably 1,200 to 9,000 seconds, further preferably 3,600 to 8,100 seconds.

In the subsequent cooling step, a range of temperature in which the cooling rate is controlled and the cooling rate itself are important factors. The range of temperature in which the cooling rate is controlled is the range of from the heat treatment temperature to a temperature of 2,273 K or lower, preferably the range of from the heat treatment temperature to a temperature of 2,473 K, especially preferably the range of from 2,613 to 2,473 K.

The cooling rate is controlled to be in the range of from 50 to 300 K/hr. The reason that the cooling rate is controlled to be in this range is as follows. In the slow cooling step at a cooling rate of less than 50 K/hr, strain caused by stresses due to the cooling is absorbed as variation of the lattice plane orientations (the range of variation on the $\Delta\omega$ coordinates), and hence is not introduced as variation of the lattice spacings ($2\theta$) (the range of variation on the $2\theta$ coordinates). On the other hand, when the cooling rate is more than 300 K/hr, variation of the lattice spacings in a region surrounded by the subboundary is increased, making it difficult to control the range of variation on the $2\theta$ coordinates to be within the above range. The cooling rate is preferably in the range of from 60 to 250 K/hr, further preferably 80 to 200 K/hr. In a typical arc electrofusing method, stresses caused due to the difference in thermal shrinkage during the cooling are generated in the single crystal, forming a number of subboundaries. However, since both the melt and the raw material carrying the melt are cooled together, the cooling rate is extremely reduced, and, thus making it difficult to control the cooling rate to be in the desired range.

After cooling the resultant single crystal to a temperature of 2,473 K or lower with controlling the cooling rate in the predetermined temperature range, it is preferred that the control of the cooling rate is stopped and the single crystal is cooled to, for example, about room temperature at an arbitrary cooling rate in a way of allowing the single crystal to cool naturally in the furnace, or forcibly cooling it by means of a forced cooling machine provided in the heating furnace.

By subjecting the raw material MgO single crystal obtained by an arc electrofusing method to the heat treatment in the present invention, the range of variation of diffraction line coordinate positions, as measured for reciprocal lattice maps with respect to a region surrounded by the same subboundary, can be controlled to be in predetermined respective ranges, in terms of the lattice spacing $2\theta$ and the lattice plane orientation $\Delta\omega$, so that the single crystal is controlled in crystalline properties, thus obtaining desired properties.

The thus obtained MgO single crystal having controlled crystallinity of the present invention can be applied to a wide variety of uses, such as a substrate for oxide superconductor thin film, a substrate for oxide dielectric thin film, a high heat-conductive substrate, an optical lens, a window material for infrared ray transmission, and a target material used in vapor deposition or sputtering for producing, e.g., a protective film for plasma display panel (PDP). Particularly, the MgO single crystal having controlled crystallinity is very advantageously used as a substrate for oxide superconductor thin film since it remarkably improves the superconducting properties of an oxide superconductor thin film formed on the substrate.

EXAMPLES

The present invention will be described in more detail with reference to the following Examples, which should not be construed as limiting the scope of the present invention.

1. Preparation of Raw Material MgO Single Crystal by Arc Electrofusing Method and Preparation of Substrate by Processing the Single Crystal 1) A Raw Material MgO Single Crystal "A" and a Substrate "A-1" of a MgO Single Crystal Having Uncontrolled Crystallinity Obtained by Processing the Single Crystal 5 tons of seawater magnesia clinker (particle diameter: 5 mm or less) having a composition: MgO: 99.5%; CaO: 0.2%; $SiO_2$: 0.17%; $Fe_2O_3$: 0.05%; $Al_2O_3$: 0.06%; and $B_2O_3$: 0.002%, wherein each % is given by mass, was placed in an electric furnace having an inner diameter of 1.5 m$\phi$ and a height of 1.5 m to form a magnesia clinker layer having a thickness of 1.3 m. 2 tons of powdered magnesia having a particle size preliminarily adjusted to 30 to 390 mesh was put on the resultant magnesia clinker layer from the upper portion of the electric furnace to form a magnesia powder layer having a thickness of 0.2 m. Then, using carbon electrodes embedded in the electric furnace, an electric current was applied for 40 hours (corresponding to an electric power of 14,000 kWH) to effect electrical fusion, obtaining a plurality of raw material MgO single crystals "A" having a size of about 100 mm×100 mm×100 mm. The obtained raw material MgO single crystal "A" was subjected to processing by cleavage, lapping, and polishing to obtain a substrate "A-1" of a MgO single crystal having uncontrolled crystallinity having a surface roughness Ra of $3\times10^{-10}$ m or less and a size of 10 mm×10=m×0.5 mm.

2) Raw Material MgO Single Crystal "B" and a Substrate "B-1" of a MgO Single Crystal Having Uncontrolled Crystallinity Obtained by Processing the Single Crystal A preparation of MgO single crystal was conducted in substantially the same manner as in the preparation of raw material MgO single crystal "A", except that the thickness of the magnesia clinker layer was 1.2 m, that the thickness of the magnesia powder layer was 0.1 m, and that the time for applying electric current was 30 hours (corresponding to an electric power of 12,000 kWH), obtaining a plurality of raw material MgO single crystals "B" having a size of about 90 mm×90 mm×90 mm. The obtained raw material MgO single crystal "B" was subjected to processing by cleavage, lapping, and polishing to obtain a substrate "B-1" of a MgO single crystal having uncontrolled crystallinity having a surface roughness Ra of $3 \times 10^{-10}$ m or less and a size of 10 mm×10 mm×0.5 mm.

3) Raw Material MgO Single Crystal "C" and a Substrate "C-1" of a MgO Single Crystal Having Uncontrolled Crystallinity Obtained by Processing the Single Crystal A preparation of MgO single crystal was conducted in substantially the same manner as in the preparation of raw material MgO single crystal "A", except that the thickness of the magnesia clinker layer was 1.4 m, that the thickness of the magnesia powder layer was 0.1 m, and that the time for applying electric current was 25 hours (corresponding to an electric power of 9,000 kWH), obtaining a plurality of raw material MgO single crystals "C" having a size of about 70 mm×70 mm×70 mm. The obtained raw material MgO single crystal "C" was subjected to processing by cleavage, lapping, and polishing to obtain a substrate "C-1" of a MgO single crystal having uncontrolled crystallinity having a surface roughness Ra of $3 \times 10^{-10}$ m or less and a size of 10 mm×10 mm×0.5 mm.

2. Preparation of a Substrate of the MgO Single Crystal Having Controlled Crystallinity Example 1

The above-obtained raw material MgO single crystal "A" was put on a carbon crucible, and the crucible was placed in a closed carbon resistance heating furnace, and the furnace was evacuated and then, the pressure in the furnace was increased to 0.5 MPa with Ar gas and then the temperature in the furnace was elevated to 1,773 K over 30 minutes, and further elevated to 2,723 K at a temperature elevation rate of 600 K/hr. This temperature was kept for 600 seconds (heat-treatment temperature retention time) and then the furnace was cooled to 2,473 K (cooling controlled temperature) at a cooling rate of 100 K/hr, followed by cooling to room temperature over 14 hours. The thus heat-treated MgO single crystal having controlled crystallinity was subjected to processing by cleavage, lapping, and polishing to obtain a substrate of the MgO single crystal having controlled crystallinity having a surface roughness Ra of $3 \times 10^{-10}$ m or less and a size of 10 mm×10 mm×0.5 mm.

Example 2

A heat treatment was conducted in substantially the same manner as in Example 1, except that the pressure in the furnace was increased to 0.9 MPa with Ar gas, that the temperature in the furnace was elevated to 2,873 K, and that the furnace was cooled to 2,473 K at a cooling rate of 150 K/hr, to obtain a substrate of the MgO single crystal having controlled crystallinity.

Example 3

A heat treatment was conducted in substantially the same manner as in Example 1, except that raw material MgO single crystal "B" was used, that the pressure in the furnace was increased to 0.8 MPa with Ar gas, that the temperature in the furnace was elevated to 2,823 K, and that the furnace was cooled to 2,473 K at a cooling rate of 200 K/hr, to obtain a substrate of the MgO single crystal having controlled crystallinity.

Example 4

A heat treatment was conducted in substantially the same manner as in Example 1, except that raw material MgO single crystal "C" was used, that the pressure in the furnace was increased to 0.6 MPa with Ar gas, that the temperature in the furnace was elevated to 2,773 K, and that the furnace was cooled to 2,473 K at a cooling rate of 80 K/hr, to obtain a substrate of the MgO single crystal having controlled crystallinity.

Example 5

A heat treatment was conducted in substantially the same manner as in Example 4, except that the retention time after the temperature elevation in the heat treatment was changed to 300 seconds, and that the furnace was cooled to 2,273 K at a cooling rate of 80 K/hr, to obtain a substrate of the MgO single crystal having controlled crystallinity.

Example 6

A heat treatment was conducted in substantially the same manner as in Example 4, except that the retention time after the temperature elevation in the heat treatment was changed to 2,400 seconds, and that the furnace was cooled to 2,073 K at a cooling rate of 100 K/hr, to obtain a substrate of the MgO single crystal having controlled crystallinity.

Comparative Example 1

A heat treatment was conducted in substantially the same manner as in Example 1, except that the pressure in the furnace was increased to 0.3 MPa with Ar gas, that the temperature in the furnace was elevated to 2,573 K, and that the furnace was cooled to 2,073 K at a cooling rate of 100 K/hr, to obtain a substrate of the MgO single crystal having controlled crystallinity.

Comparative Example 2

A heat treatment was conducted in substantially the same manner as in Example 3, except that the furnace was cooled to 2,473 K at a cooling rate of 30 K/hr, to obtain a substrate of the MgO single crystal having controlled crystallinity.

Comparative Example 3

A heat treatment was conducted in substantially the same manner as in Example 3, except that the furnace was cooled to 2,273 K at a cooling rate of 600 K/hr, to obtain a substrate of the MgO single crystal having controlled crystallinity.

Comparative Example 4

A heat treatment was conducted in substantially the same manner as in Example 4, except that the retention time after the temperature elevation in the heat treatment was changed to 18,000 seconds, and that the furnace was cooled to 2,073 K at a cooling rate of 80 K/hr, to obtain a substrate of the MgO single crystal having controlled crystallinity.

Comparative Example 5

A heat treatment was conducted in substantially the same manner as in Example 4, except that the furnace was cooled to 2,573 K at a cooling rate of 80 K/hr and then gradually cooled to 2,073 K at a cooling rate of 30 K/hr, to obtain a substrate of the MgO single crystal having controlled crystallinity.

Comparative Example 6

A heat treatment was conducted in substantially the same manner as in Example 1, except that the pressure in the furnace was increased to 1.8 MPa with Ar gas, and that the temperature in the furnace was elevated to 2,943 K, to obtain a substrate of the MgO single crystal having controlled crystallinity.

Comparative Example 7

A heat treatment was conducted in substantially the same manner as in Example 6, except that the retention time after the temperature elevation in the heat treatment was changed to 4,800 seconds, to obtain a substrate of the MgO single crystal having controlled crystallinity.

3. Evaluation of the Substrates of the MgO Single Crystal Having Controlled Crystallinity With respect to each of the substrates of the MgO single crystal having controlled crystallinity obtained in Examples 1 to 6 and Comparative Examples 1 to 7, the following tests for evaluation were conducted. The results are shown in Table 1. In addition, for comparison with the substrates of the MgO single crystals having controlled crystallinity, with respect to each substrate of "A-1", "B-1", and "C-1" of the MgO single crystals having uncontrolled crystallinity, the following tests for evaluation were conducted, and the results are shown in Table 1. The substrates of the MgO single crystals having uncontrolled crystallinity and the substrates of the MgO single crystals having controlled crystallinity are obtained by processing the raw material MgO single crystal and heat-treated raw material MgO single crystal, respectively. In this processing, the substrate is polished so that it has a surface roughness Ra of $3 \times 10^{-10}$ m or less, removing the modified layer introduced in the lapping step, and hence the processing does not cause a change in the crystalline properties. Therefore, in the reciprocal lattice map measurements below, the range of variation of the crystalline properties of the substrate of the MgO single crystals having uncontrolled crystallinity shown in Table 1 is the same as that of the raw material MgO single crystal before the heat treatment, and the range of variation of the crystalline properties of the substrate of the MgO single crystal having controlled crystallinity is the same as that of the heat-treated raw material MgO single crystal.

1) Specifying Subboundary

A topography measurement was conducted by a symmetrical reflection method using a Lang camera. A Cu—Kα line of X-rays was used, and a MgO (400) diffraction line was used.

2) A Reciprocal Lattice Map Measurement (a Range of Variation on Diffraction Line 2θ Coordinates or Δω Coordinates)

A sample for the measurement was set by a half-cutting and axis-aligning operation as usual, and then the reciprocal lattice map measurement was conducted. As a location of measurement, an arbitrary large region surrounded by a grain boundary was selected from the topographic image preliminarily measured, and, as shown in FIG. 1, a center portion (A) of the grain boundary region and arbitrary 4 points (B to E) $200 \times 10^{-6}$ m or more away from the center portion in the perpendicular or horizontal direction, i.e., 5 points in total were evaluated. All the points selected for the measurements were $100 \times 10^{-6}$ m or more away from the grain boundary.

The X-ray that was used for the measurements was a collimated microbeam having a wavelength of $0.82656 \times 10^{-10}$ m, a height of $3.7 \times 10^{-6}$ m, a width of $2.5 \times 10^{-6}$ m, and an angle of divergence of 0.0014 degree. The X-ray can be utilized in a large-size radiation system SPring-8BL24-C2 hatch.

A diffraction plane MgO (400) is used, and 2θ is 46.1 degrees. The diffracted light was passed through two monochromators of Si (111) crystal and an RS slit having lengthwise and transverse widths of $1 \times 10^{-3}$ m, respectively, and then detected by a scintillation counter.

For the reciprocal lattice map measurements, a 2θ-Δω radial step scanning method was used at a $2 \times 10^{-4}$ degree step with respect to the 2θ and at a $1 \times 10^{-4}$ degree step with respect to the Δω.

Figure 2:
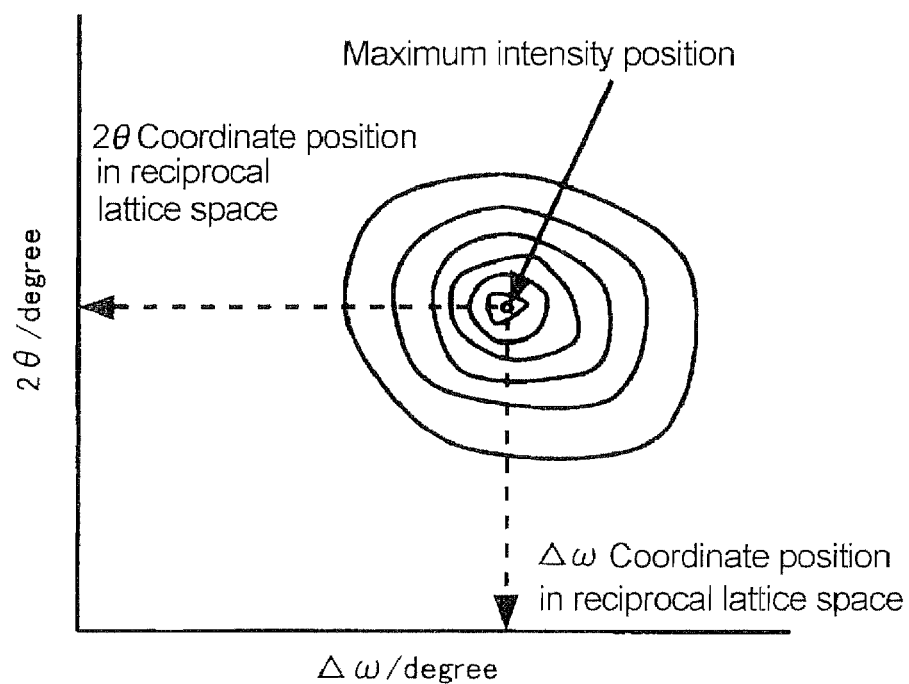
[FIG. 2] Diagram for explaining an example of a reciprocal lattice map measurement and a coordinate position at which the maximum intensity is given.
Figure 3:
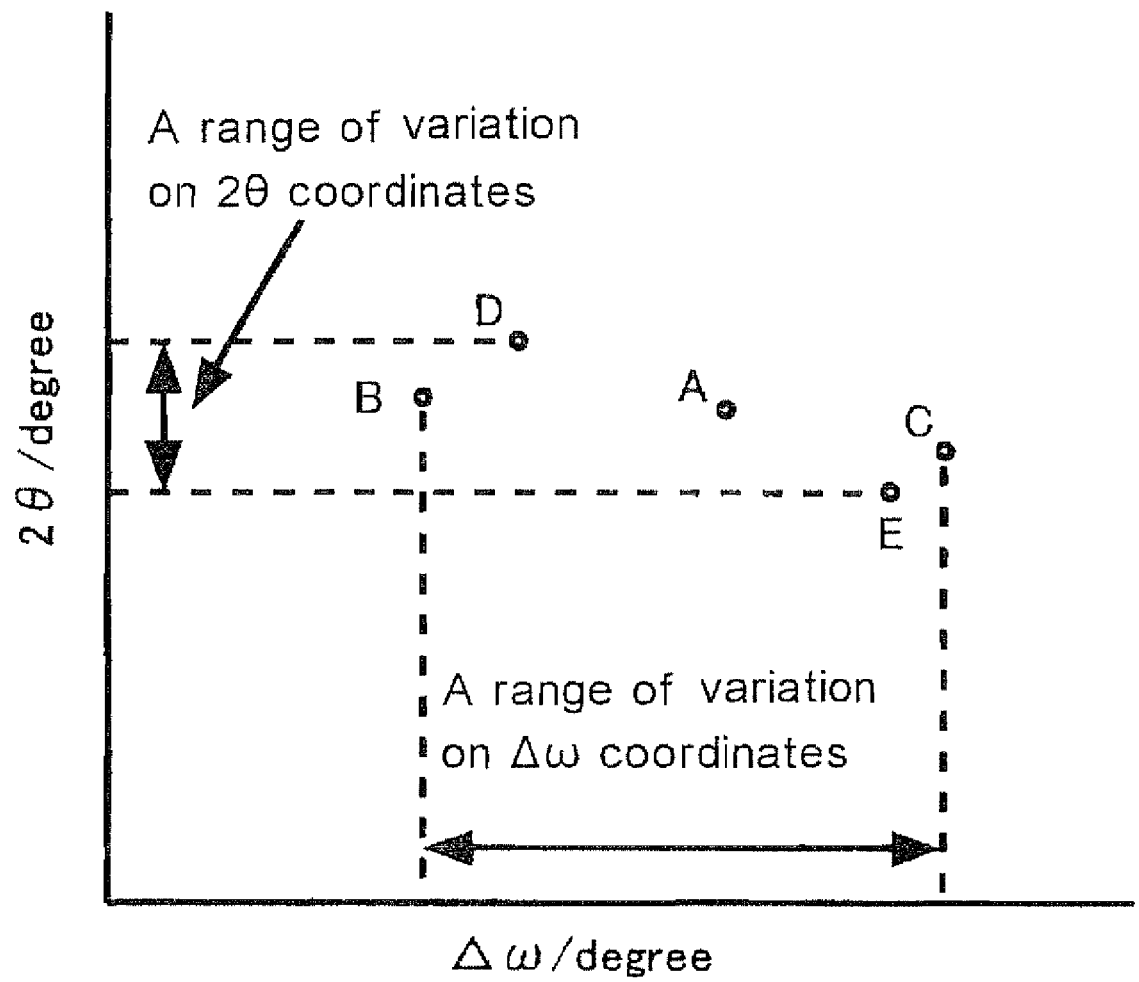
[FIG. 3] Diagram showing coordinate positions at which the maximum intensity is given for 5 points in a region surrounded by the same subboundary and the ranges of variation.

With respect to each of a plurality of reciprocal lattice maps measured for 5 points in a region surrounded by the same subboundary, reciprocal lattice space coordinates on which the maximum intensity was given in the reciprocal lattice space were determined in respect of 2θ and Δω coordinates, and an absolute value of the difference between the maximum value and the minimum value was defined as a range of variation of the diffraction line coordinate positions in a region surrounded by the subboundary. FIG. 2 is a diagram showing an example of a reciprocal lattice map measurement and a coordinate position at which the maximum intensity is given, and FIG. 3 is a diagram showing, for example, coordinate positions at which the maximum intensity is given for 5 points A to E in FIG. 1 and the ranges of variation.

3) Superconducting Properties

On each of the substrate of a MgO single crystal having controlled crystallinity in Examples 1 to 6 and Comparative Examples 1 to 7, a Bi—Sr—Ca—Cu—O superconductor thin film was deposited by RF sputtering process. Conditions for deposition are as follows.

| | |
|---|---|
| Sputtering gas: | $Ar:O_2 = 8:2$ |
| Sputtering pressure: | 2 Pa |
| Substrate temperature: | 1,003 K |
| Frequency of high frequency wave: | 13.56 MHz |
| Power of high frequency wave: | 65 W |
| Deposition rate: | $1.4 \times 10^{-10}$ m/s |
| Film thickness: | $6,000 \times 10^{-10}$ m |
| Target composition: | Bi:Sr:Ca:Cu = 2.5:2.1:1.0:2.0 |

The superconductor thin film deposited under the above conditions was analyzed by a fluorescence X-ray analysis method. As a result, it has been found that the thin film has a composition Bi:Sr:Ca:Cu=2:2:1:2. With respect to the superconducting properties of the Bi—Sr—Ca—Cu—O superconductor thin film, a critical temperature (Tc) and a critical current density (Ic) were measured by a four-terminal method, and the results are shown in Table 1.

TABLE 1

| | | Substrates of the MgO single crystals having uncontrolled crystallinity | | | | Heat treatment conditions for raw material MgO single crystals | | |
|---|---|---|---|---|---|---|---|---|
| | | Range of variaion of crystalline properties | | Superconducting properties | | Temperature elevation rate (K/hr) | Heat treatment temperature (K) | Heat-treatment temperature retention time (sec) |
| | Type | 2θ (degree) | Δω (degree) | Tc (K) | Ic (A/m²) | | | |
| Example 1 | A-1 | <2 × 10⁻⁴ | 5.0 × 10⁻³ | 110 | 3.3 × 10³ | 600 | 2723 | 600 |
| Example 2 | A-1 | <2 × 10⁻⁴ | 5.0 × 10⁻³ | 110 | 3.3 × 10³ | 600 | 2873 | 600 |
| Example 3 | B-1 | <2 × 10⁻⁴ | 2.5 × 10⁻³ | 112 | 5.6 × 10³ | 600 | 2823 | 600 |
| Example 4 | C-1 | <2 × 10⁻⁴ | 3.0 × 10⁻² | 106 | 7.8 × 10² | 600 | 2773 | 600 |
| Example 5 | C-1 | <2 × 10⁻⁴ | 3.0 × 10⁻² | 106 | 7.8 × 10² | 600 | 2773 | 300 |
| Example 6 | C-1 | <2 × 10⁻⁴ | 3.0 × 10⁻² | 106 | 7.8 × 10² | 600 | 2773 | 2400 |
| Comparative Example 1 | A-1 | <2 × 10⁻⁴ | 5.0 × 10⁻³ | 110 | 3.3 × 10³ | 600 | 2573 | 600 |
| Comparative Example 2 | B-1 | <2 × 10⁻⁴ | 2.5 × 10⁻³ | 112 | 5.6 × 10³ | 600 | 2823 | 600 |
| Comparative Example 3 | B-1 | <2 × 10⁻⁴ | 2.5 × 10⁻³ | 112 | 5.6 × 10³ | 600 | 2823 | 600 |
| Comparative Example 4 | C-1 | <2 × 10⁻⁴ | 3.0 × 10⁻² | 106 | 7.8 × 10² | 600 | 2773 | 18000 |
| Comparative Example 5 | C-1 | <2 × 10⁻⁴ | 3.0 × 10⁻² | 106 | 7.8 × 10² | 600 | 2773 | 600 |
| Comparative Example 6 | A-1 | <2 × 10⁻⁴ | 5.0 × 10⁻³ | 110 | 3.3 × 10³ | 600 | 2943 | 600 |
| Comparative Example 7 | C-1 | <2 × 10⁻⁴ | 3.0 × 10⁻² | 106 | 7.8 × 10² | 600 | 2773 | 4800 |

| | Heat treatment conditions for raw material MgO single crystals | | | Substrates of the MgO single crystals having controlled crystallinity | | | |
|---|---|---|---|---|---|---|---|
| | Cooling | | | Range of variation of crystalline properties | | Superconducting properties | |
| | Cooling rate (K/hr) | controlled temperature(K) | Total retention time (sec) | 2θ (degree) | Δω (degree) | Tc (K) | Ic (A/m²) |
| Example 1 | 100 | 2473 | 5220 | 8.0 × 10⁻⁴ | 9.6 × 10⁻³ | 116 | 3.6 × 10⁴ |
| Example 2 | 150 | 2473 | 8400 | 1.0 × 10⁻³ | 1.4 × 10⁻² | 118 | 5.2 × 10⁴ |
| Example 3 | 200 | 2473 | 5640 | 2.4 × 10⁻³ | 8.5 × 10⁻³ | 118 | 7.4 × 10⁴ |
| Example 4 | 80 | 2473 | 8760 | 6.0 × 10⁻⁴ | 1.7 × 10⁻³ | 115 | 1.8 × 10⁴ |
| Example 5 | 80 | 2273 | 8460 | 6.0 × 10⁻⁴ | 2.8 × 10⁻³ | 115 | 1.7 × 10⁴ |
| Example 6 | 100 | 2073 | 9120 | 6.0 × 10⁻⁴ | 1.2 × 10⁻³ | 115 | 1.7 × 10⁴ |
| Comparative Example 1 | 100 | 2073 | 0 | <2 × 10⁻⁴ | 7.2 × 10⁻³ | 109 | 2.7 × 10³ |
| Comparative Example 2 | 30 | 2473 | 27060 | 2 × 10⁻⁴ | 2.9 × 10⁻³ | 111 | 4.1 × 10³ |
| Comparative Example 3 | 600 | 2273 | 3120 | 9.6 × 10⁻³ | 1.9 × 10⁻² | 107 | 6.2 × 10² |
| Comparative Example 4 | 80* | 2073 | 26160 | 4.0 × 10⁻⁴ | 6.0 × 10⁻⁴ | 112 | 9.4 × 10³ |
| Comparative Example 5 | 80 | 2573 | 8760 | 2 × 10⁻⁴ | 9.4 × 10⁻⁴ | 110 | 5.9 × 10³ |
| Comparative Example 6 | 100 | 2473 | 14460 | 1.0 × 10⁻³ | 4.0 × 10⁻⁴ | 112 | 9.1 × 10³ |
| Comparative Example 7 | 80 | 2073 | 12960 | 6.0 × 10⁻⁴ | 8.0 × 10⁻⁴ | 112 | 9.8 × 10³ |

*Cooling rate at 2,773 to 2,573 K and 2,573 to 2,073 K is 30 K/hr.

As is apparent from the results shown in Table 1, when the heat treatment temperature for the raw material MgO single crystal is lower than 2,613 K (Comparative Example 1), change of crystalline properties is almost nothing during the heat-treated MgO single crystal, so that desired variation of the crystalline properties cannot be achieved. When the total time of keeping the heat treatment temperature in the range of 2,613 K or higher is longer than 10,800 seconds (Comparative Examples 2, 4, 6, and 7), the range of variation on the Δω coordinates became considerably small, even the cooling rate was selected appropriately. Further, when the cooling rate for cooling to 2,473 K is not controlled to be within a predetermined range (Comparative Examples 2, 3, and 5), desired variation of the crystalline properties cannot be achieved.

By contrast, in the MgO single crystals that have been subjected to the heat treatment in the present invention (Examples 1 to 6), the range of variation of the crystalline properties after the heat treatment is controlled in a desired range. It has been found that a superconductor thin films formed on the substrates of the MgO single crystals having controlled crystallinity obtained from the above heat-treated MgO single crystals are remarkably improved in superconducting properties, as compared to the superconductor thin films formed on the substrates of the MgO single crystals having uncontrolled crystallinity obtained from the raw material MgO single crystals which have not been subjected to the heat treatment. The reason for this is presumed that variation of the lattice spacings and lattice plane orientations in a region surrounded by the same subboundary serves as a pinning center for the oxide superconductor thin film formed on the substrate, drastically improving the superconducting properties.

As described above in detail, in the MgO single crystal having controlled crystallinity of the present invention, the crystalline properties are controlled so that the diffraction line coordinate positions in reciprocal lattice maps have a specific range of variation. Therefore, for example, when the MgO single crystal having controlled crystallinity is used as a substrate for oxide superconductor thin film, it can remarkably improve the superconducting properties of an oxide superconductor thin film formed on the substrate.

The invention claimed is:

1. A magnesium oxide single crystal having controlled crystallinity comprising a subboundary, and ranges of variation of diffraction line coordinate positions, as measured for reciprocal lattice maps with respect to a region surrounded by the same subboundary, with the range of the variation of $1\times10^{-3}$ to $2\times10^{-2}$ degree on $\Delta\omega$ coordinates, and with the range of the variation of $4\times10^{-4}$ to $5\times10^{-3}$ degree on $2\theta$ coordinates.

2. A substrate of the magnesium oxide single crystal having controlled crystallinity obtained from the magnesium oxide single crystal having controlled crystallinity according to claim 1.

3. A superconducting device comprising a thin film comprised of a material having superconducting properties formed on the substrate of the magnesium oxide single crystal having controlled crystallinity according to claim 2.

4. A method for producing a magnesium oxide single crystal having controlled crystallinity, the method comprising steps of:

preparing a magnesium oxide single crystal;

elevating the temperature of the magnesium oxide single crystal to 2,613 K or higher by heating; and, immediately after completion of the temperature elevation, or after keeping the temperature for a predetermined time period, cooling the resultant magnesium oxide single crystal to 2,473 K at a cooling rate of 50 to 300 K/hr, wherein the method further comprises subjecting the magnesium oxide single crystal to the heat treatment with keeping the temperature in the range of 2,613 K or higher, for a total time period of 10,800 seconds or shorter including time required for the temperature elevation and the cooling.

5. The method according to claim 4, wherein the magnesium oxide single crystal which has not been subjected to the heat treatment is prepared by an arc electrofusing method.

* * * * *